United States Patent
Qu et al.

(10) Patent No.: US 9,577,117 B2
(45) Date of Patent: Feb. 21, 2017

(54) SUPER-JUNCTION SCHOTTKY OXIDE PIN DIODE HAVING THIN P-TYPE LAYERS UNDER THE SCHOTTKY CONTACT

(71) Applicant: Robert Bosch GmbH, Stuttgart (DE)

(72) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 439 days.

(21) Appl. No.: 13/760,894

(22) Filed: Feb. 6, 2013

(65) Prior Publication Data

US 2013/0207222 A1   Aug. 15, 2013

(30) Foreign Application Priority Data

Feb. 9, 2012 (DE) .................. 10 2012 201 911

(51) Int. Cl.
  *H01L 29/872* (2006.01)
  *H01L 29/868* (2006.01)
  *H01L 29/06* (2006.01)

(52) U.S. Cl.
  CPC ......... *H01L 29/872* (2013.01); *H01L 29/0634* (2013.01); *H01L 29/868* (2013.01); *H01L 29/0649* (2013.01)

(58) Field of Classification Search
  CPC ............ H01L 29/872; H01L 29/66143; H01L 29/0619; H01L 29/0623; H01L 29/407; H01L 29/7391

(Continued)

(56) References Cited

U.S. PATENT DOCUMENTS 6,184,545 B1   2/2001   Werner et al.
6,590,240 B1 *  7/2003   Lanois ............... H01L 29/0634
                                                    257/256

(Continued)

FOREIGN PATENT DOCUMENTS

DE        197 40 195        3/2003

OTHER PUBLICATIONS 13760894.pdf. Stanley Wolf Ph.D.,Silicon Processing for the VLSI Era, vol. 2: Process Integration, Published by Lattice Press in 1990, p. 87,134,135.*

(Continued)

*Primary Examiner* — Kenneth Parker
*Assistant Examiner* — Fang-Xing Jiang
(74) *Attorney, Agent, or Firm* — Gerard Messina

(57) ABSTRACT

A semiconductor chip, which includes an n-type substrate, over which an n-type epitaxial layer having trenches introduced into the epitaxial layer and filled with p-type semiconductor is situated, the trenches each having a heavily doped p-type region on their upper side, the $n^+$-type substrate being situated in such a manner, that an alternating sequence of n-type regions having a first width and p-type regions having a second width is present; a first metallic layer, which is provided on the front side of the semiconductor chip, forms an ohmic contact with the heavily doped p-type regions and is used as an anode electrode; a second metallic layer, which is provided on the back side of the semiconductor chip, constitutes an ohmic contact and is used as a cathode electrode; a dielectric layer provided, in each instance, between an n-type region and an adjacent p-type region, as well as p-type layers provided between the n-type regions and the first metallic layer.

15 Claims, 6 Drawing Sheets

(58) Field of Classification Search
USPC .................... 257/480, 481, 109; 327/543
See application file for complete search history.

(56) References Cited

U.S. PATENT DOCUMENTS

| | | | | |
|---|---|---|---|---|
| 2005/0242411 A1* | 11/2005 | Tso | ................ | H01L 29/872 257/480 |
| 2009/0322417 A1* | 12/2009 | Hirler | ............ | H01L 29/407 327/543 |
| 2010/0237456 A1* | 9/2010 | Qu | ................ | H01L 29/0619 257/481 |
| 2012/0193676 A1* | 8/2012 | Bobde | ........... | H01L 29/7391 257/140 |

OTHER PUBLICATIONS

Fujihira, "Theory of Semiconductor Superjunction Device," *Japan J. Applied Physics.* vol. 36, pp. 6254-6262 (1997).

\* cited by examiner

SUPER-JUNCTION SCHOTTKY OXIDE PIN DIODE HAVING THIN P-TYPE LAYERS UNDER THE SCHOTTKY CONTACT

CROSS REFERENCE

The present application claims the benefit under 35 U.S.C. §119 of German Patent Application No. DE 102012201911.1 filed on Feb. 9, 2012, which is expressly incorporated herein by reference in its entirety.

BACKGROUND INFORMATION

Within the scope of the topic of $CO_2$, increasingly efficient current converters are needed. Examples include inverters for photovoltaic or automotive applications. High-level blocking, low-loss and rapidly-switching power semiconductors are necessary for this. Apart from active semiconductor switches, such as IGBT's or CoolMOS transistors, free-wheeling diodes are also necessary. Generally, PIN diodes made of silicon are used for high-voltage applications. PIN diodes exhibit low forward voltages and low reverse currents and, consequently, low forward and reverse losses. However, high switching losses, which occur as switching-off losses during the commutation of the current, are disadvantageous.

High-voltage PIN diodes are PN diodes, in which an undoped (intrinsic) and, in practice, mostly lightly doped layer i is situated between p-type and n-type regions. The reverse voltage is chiefly received by lightly doped region i. The space charge region extends mainly in the lightly doped region. The dopant concentration and the thickness of this lightly doped region are determined by the specified breakdown voltage. A high breakdown voltage means a low dopant concentration and high thickness of this lightly doped region. For a 600 V diode, the dopant concentration of the i-layer is approximately $3 \cdot 10^{14}$ cm$^{-3}$, and the layer thickness is approximately 50 micrometers.

During conducting-state operation at a high current density, high-level injection occurs in PIN diodes. In this context, electrons and holes are injected into the lightly doped region. In the process, the concentration of the injected minority carriers exceeds the dopant concentration of the lightly doped region. This markedly increases the conductivity of the lightly doped region. Consequently, the voltage drop at the lightly doped center region remains small. The forward voltage at high currents remains low. In contrast to that, no increase in the charge carrier density takes place in majority carrier components, such as Schottky diodes. The lightly doped region constitutes a large ohmic resistor, at which a correspondingly high voltage decreases in the forward direction.

During switching-off, the charge carriers (electrons and holes), which are injected in the forward direction into the lightly doped region during the operation of PIN diodes, must first be depleted before the diode can take on reverse voltage. Thus, in response to abrupt commutation of the current, the current initially continues to flow in the reverse direction, until the stored charge carriers are removed or depleted. This current is also referred to as depletion current or reverse recovery current. The magnitude and duration of the depletion current is determined, first and foremost, by the amount of charge carriers stored in the lightly doped region. The more charge carriers present, the higher the depletion current. A higher depletion current means a higher switching-off power loss. By integrating the switching-off current with respect to time, one obtains stored charge Qrr (reverse recovery charge), which is an important variable for describing the switching-off power loss and should be as low as possible. In the case of PIN diodes, switching times and switching losses are high.

Schottky diodes (metal-semiconductor contacts or silicide-semiconductor contacts) provide an improvement in the switching performance. In the case of Schottky diodes, high-level injection does not take place during conducting-state operation. Therefore, the need for sweeping out the minority carriers is eliminated. Schottky diodes switch rapidly and with nearly no loss. However, thick and lightly doped semiconductor layers are again necessary for high reverse voltages, which, in the case of high currents, results in unacceptable, high forward voltages. Therefore, in spite of good switching performance, power Schottky diodes manufactured using silicon technology are not suitable for reverse voltages over approximately 100 V.

A semiconductor component, which is referred to in the following as a cool SED diode, is described in German Patent Application No. DE 197 40 195 C2. In this diode, the introduction of doped, alternatingly positioned p-type and n-type conducting columns under a Schottky contact allows the resistance to be lowered almost as much as desired. If the column width is reduced, the column dopings may be increased. In this context, the doping of the p-type and n-type columns is selected, such that all of the dopant atoms are ionized in response to the application of a reverse voltage. This principle is also referred to as the super-junction principle (SJ). Since a certain minority carrier injection takes place via the p-type doped columns, the ideal switching performance of a pure Schottky diode is not attained, but it is markedly improved over a PIN diode. However, the low forward voltage of the PIN diode is not obtained at high currents. The super-junction principle is described, for example, in the magazine, Japanese Journal of Applied Physics, Vol. 36, pages 6254-6262.

A super-junction Schottky oxide PIN diode is described in German Patent Application No. DE 10 2011 080 258.4. This has a trench structure including parallelly connected Schottky and PIN diodes, in which the Schottky and the PIN regions are galvanically separated and have charge carrier compensation (super-junction structure). The galvanic separation of the Schottky and PIN structure allows high-level injection to take place in the PIN regions. At nearly comparable switching-off losses, the forward voltage is less than in the case of the conventional cool SBD diode.

A cross section of a detail of an example of a super-junction Schottky oxide PIN diode (SJSOP) is illustrated in FIG. 1. A SJSOP is made up of an n$^+$-type substrate 10, on which an n-type epitaxial layer 20 of thickness D_epi and dopant concentration ND is situated. The n-type epitaxial layer 20 includes etched-in trenches 30, which are filled with p-type silicon of dopant concentration NA and are filled with p$^+$-type silicon 40 on the upper side. The width of n-type regions 20 is Wn, and that of the p-type and p$^+$-type regions 30 and 40 is Wp. The dopant concentrations and widths are selected so that all of the regions 20 and 30 are depleted upon application of the full reverse voltage (super-junction principle). This is approximately the case when $NA \cdot Wp = ND \cdot Wn = 10^{12}$ cm$^{-2}$. Dielectric layers 70, which are preferably $SiO_2$ layers having a thickness D_ox, are situated between the p/p$^+$-type and n-type regions. In this manner, the p-type and n-type regions are not directly connected electrically. On the front side of the chip, n-type regions 20 and p$^+$-type regions 40 are covered by a continuous metallic layer 50, which forms a Schottky contact with n-type regions 20 and an ohmic contact with p$^+$-type regions 40. Metallic layer 50 constitutes the anode contact of the diode. The barrier height of Schottky diode 50-20 may be set by selecting an appropriate metal 50. For example, nickel or NiSi may be used as a metallic layer 50. In some instances, other metallic layers not drawn in may be situated over functional layer 50, in order to render the top surface solderable or bondable. A metallic layer or metal system 60, which constitutes the ohmic contact to heavily doped $n^+$-type substrate 10, is situated on the back side. This layer or layer sequence is usually suitable for assembly by soldering or in another manner. It may be made up of a sequence of Cr, NiV and Ag. Metal system 60 forms the cathode terminal.

One may view the set-up as parallelly connected Schottky and PIN diodes. In this context, metallic contacts 50 form, together with n-type columns 20, Schottky diodes. The PIN structure is formed by the layer sequence made up of $p^+$-type region 40, p-type region 30 and substrate 10 as a $p^+/p/n^+$ structure.

When the reverse voltage is applied, the p-type and n-type columns become depleted of carriers. The doping may be increased with decreasing width Wp and Wn, at least up to a certain limit that results from the fact that the space charge regions already collide at a low voltage. This reduces the bulk resistance of Schottky diodes 50-20-10 in the forward direction. Therefore, the forward voltages are lower than in the case of a simple Schottky diode, which has a lower degree of doping at the same reverse voltage. In addition, a small current still flows through the PIN diodes in the forward direction. This further reduces the forward voltage. However, upon de-energization, the minority carriers must also be swept out again with detrimental effects on the switching time.

SUMMARY

In contrast to the above-described semiconductor set-ups, an example semiconductor chip in accordance with the present invention is a super-junction Schottky oxide PIN diode (SJSOPP) having thin p-type layers under the Schottky contact.

This SJSOPP has a semiconductor chip, including an $n^+$-type substrate, over which an n-type epitaxial layer having trenches introduced into the epitaxial layer and filled with p-type semiconductor material is situated, the trenches each having a heavily doped p-type region on their upper side, and the $n^+$-type substrate being situated in such a manner, that an alternating sequence of n-type regions having a first width and p-type regions having a second width is present; including a first metallic layer, which is provided on the front side of the semiconductor chip, forms an ohmic contact with the heavily doped p-type regions, and is used as an anode electrode; including a second metallic layer, which is provided on the back side of the semiconductor chip, constitutes an ohmic contact, and is used as a cathode electrode; and including, in each instance, a dielectric layer between an n-type region and an adjacent p-type region; in each instance, a p-type layer being provided between the n-type regions and the metallic layer.

A SJSOPP is a high-level blocking diode (high-voltage diode) having a low forward voltage, favorable switching performance and low reverse current. This diode constitutes a combination of a Schottky diode and a PIN diode, which together form a super-junction structure (SJ-structure) and are galvanically separated from one another. Furthermore, this diode additionally includes thin and lightly doped, p-type layers directly under the Schottky contact, which partially shield the Schottky contact and thereby reduce the reverse currents markedly, without increasing the forward voltages and the switching losses in the process. In comparison with conventional PIN power diodes, a SJSOPP exhibits markedly lower switching losses at low forward voltages. In comparison with a SJSOP, as is described in German Patent Application No. DE 10 2011 080 258.4, a SJSOPP has markedly lower reverse currents at nearly equal forward voltages and nearly equal switching losses.

Further advantageous features of the present invention are derived from the following explanation with reference to FIGS. 2 to 8.

DETAILED DESCRIPTION OF EXAMPLE EMBODIMENTS

Figure 2:
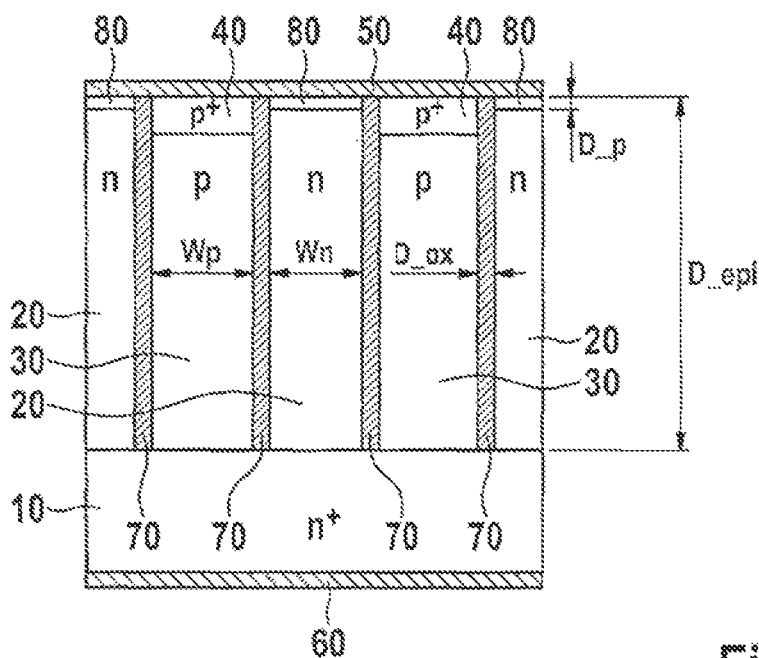
FIG. 2 shows a cross-sectional view of a detail of an example semiconductor chip according to the present invention.

FIG. 2 shows a cross-sectional view of a detail of an example semiconductor chip according to the present invention, which is a super-junction Schottky oxide PIN diode having thin p-type layers under the Schottky contact. In the following, such a diode is always referred to as a SJSOPP. A SJSOPP is made up of an $n^+$-type substrate 10, on which an n-type epitaxial layer 20 of thickness D_epi is situated. The n-type epitaxial layer 20 includes etched-in trenches 30, which are filled with p-type silicon and are filled with $p^+$-type silicon 40 on the upper side. The width of n-type regions 20 is Wn, and that of p-type and $p^+$-type regions 30 and 40 is Wp. The dopant concentrations and widths are selected so that the super-junction principle applies. Dielectric layers 70, which are preferably $SiO_2$ layers having a thickness $D_{ox}$, are provided between the $p/p^+$-type and n-type regions. In this manner, the p-type and n-type regions are galvanically separated from one another.

A metallic layer 50, which forms an anode contact of the diode, is provided on the front side of the chip. A metallic layer 60, which forms a cathode contact of the diode, is situated on the back side of the chip.

A SJSOPP in accordance with the present invention differs from the SJSOP shown in FIG. 1 in that in each instance, a thin p-type layer 80 is situated directly below the Schottky contact, which is situated, in each instance, between metallic layer 50 and n-type epitaxial layer 20. This p-type layer 80 has a thickness D_p and a dopant concentration N_p. In this manner, metallic layer 50 on the front side of the chip now forms, on one hand, an ohmic contact with $p^+$-type regions 40, just as in the case of a SJSOP, but, on the other hand, does not form a simple Schottky contact with the additional p-type layers 80 and the subjacent n-type regions 20, as in the case of a SJSOP, but forms a Schottky contact system.

The mode of operation of this Schottky contact system may be influenced by a desired dimensioning and doping of p-type layers 80 in, in each instance, a desired manner.

If p-type layers 80 are doped in a sufficiently deep and rich manner, then the Schottky contact is completely shielded. Metallic layer 50 on the front side of the chip forms an ohmic contact with p-type layers 80. Layer sequence 50-80-20-10 functions as a PIN diode: low reverse currents, high forward voltages at a low current density, and high switching losses.

If p-type layers 80 are doped in a sufficiently shallow and weak manner, then p-type layers 80 for the Schottky contact are almost completely transparent. Metallic layer 50 on the front side of the chip forms a Schottky contact with layer sequence 80-20, and layer sequence 50-80-20-10 functions as a Schottky diode: high reverse currents, high forward voltages at a high current density, and low switching losses.

If the thickness and the dopant concentration of p-type layers 80 are suitably designed, the most important parameters, such as forward voltages at a high current density, reverse currents, and switching losses, may be set or optimized according to applications and need. In this case, layer sequence 50-80-20-10 functions as a Schottky diode having partially transparent p-type layers. The optimization parameters for the p-type layers are thickness D_p and dopant concentration N_p.

In accordance with the present invention, the insertion of a thin p-type layer directly under the Schottky contact markedly reduces the reverse currents, without noticeable effects on the forward voltage and on the switching losses occurring in the process. This means that p-type layers 80 are designed to be so thin and doped so lightly, that in conducting-state operation, almost no hole injection comes from p-type layers 80, and consequently, the charge carrier distribution is nearly the same as in the case of a SJSOP; on the other hand, the p-type layers are deep and rich enough to partially shield the Schottky contact in the reverse direction.

Figure 1:
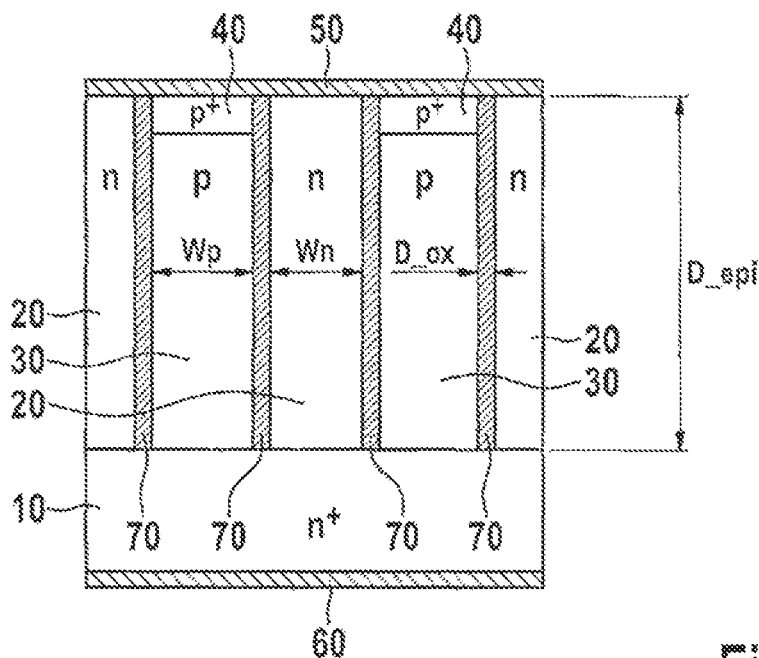
FIG. 1 shows a super-junction Schottky oxide PIN diode.

Advantages of the present invention's SJSOPP shown in FIG. 2, over a conventional, cool SBD and over a SJSOP shown in FIG. 1, are exemplarily compared using the example of 600 V diodes. For that purpose, silicon components having an active chip area of 26 mm² and a chip thickness of 200 μm are considered. The doping of substrate 10 is $10^{19}$ cm$^{-3}$. Dopant concentrations NA of n-type regions or columns 20, and ND of p-type regions or columns 30, are identical and amount to $10^{16}$ cm$^{-3}$. The alternatingly positioned n-type and p-type columns have a thickness D_epi of 35 μm. The corresponding widths Wp and Wn are each 1 μm. The p$^+$-type doping 40 is a Gaussian distribution having a surface concentration of $5\cdot10^{19}$ cm$^{-3}$ at a penetration depth of approximately 0.5 μm. The oxide layers of the SJSOP and SJSOPP structures have a thickness $D_{ox}$ of 50 nm. The barrier of the Schottky contact is 0.72 eV. The p-type layers 80, which are additionally present in the SJSOPP structure in accordance with the present invention and are situated directly below the Schottky contact, have a thickness $D_p$ of 20 nm and a dopant concentration N_p of $10^{15}$ cm$^{-3}$.

The SJSOPP structure in accordance with the present invention is also compared to a 600 V PIN diode of like area and chip thickness. The n-type epitaxial layer is 52 μm and has a dopant concentration of $3.1\cdot10^{14}$ cm$^{-3}$. The p-type anode has a Gaussian distribution, including a surface concentration of $5\cdot10^{19}$ cm$^{-3}$ at a penetration depth of 5 μm.

Figure 3:
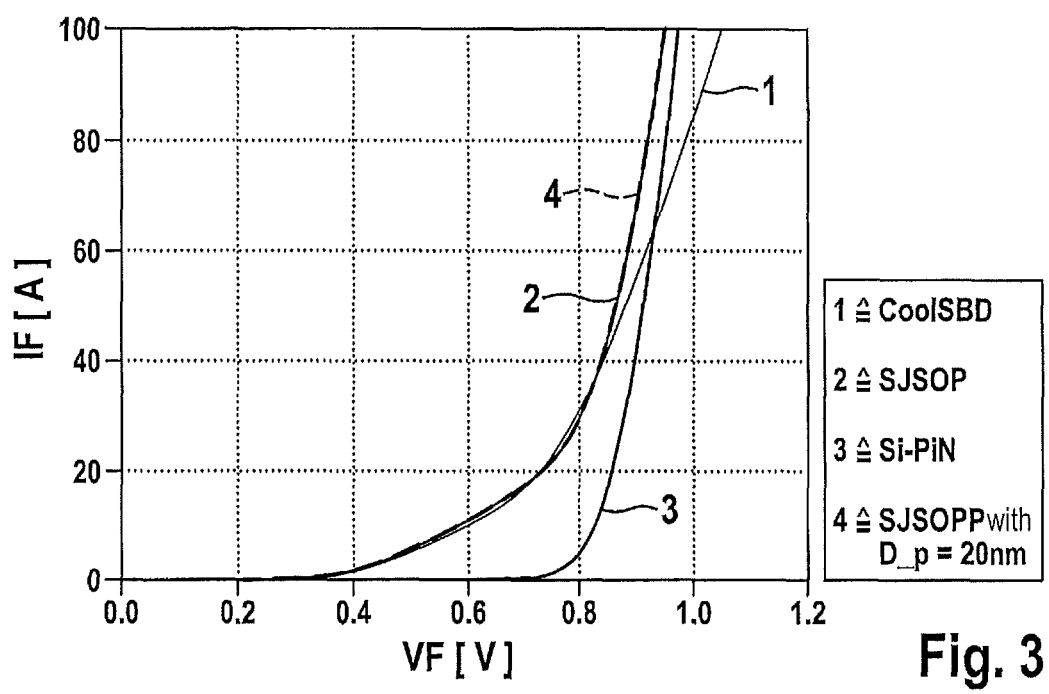
FIG. 3 shows a graph in which conducting-state characteristics are illustrated.

The forward voltages of a SJSOPP, which are measured at high currents, e.g., at 100 A, are nearly the same as in the case of the SJSOP, somewhat less than in the case of the PIN diode, and certainly less than in the case of the known cool SBD. This is illustrated in FIG. 3, in which forward voltage VF is plotted along the abscissa and forward current IF is plotted along the ordinate.

Figure 4:
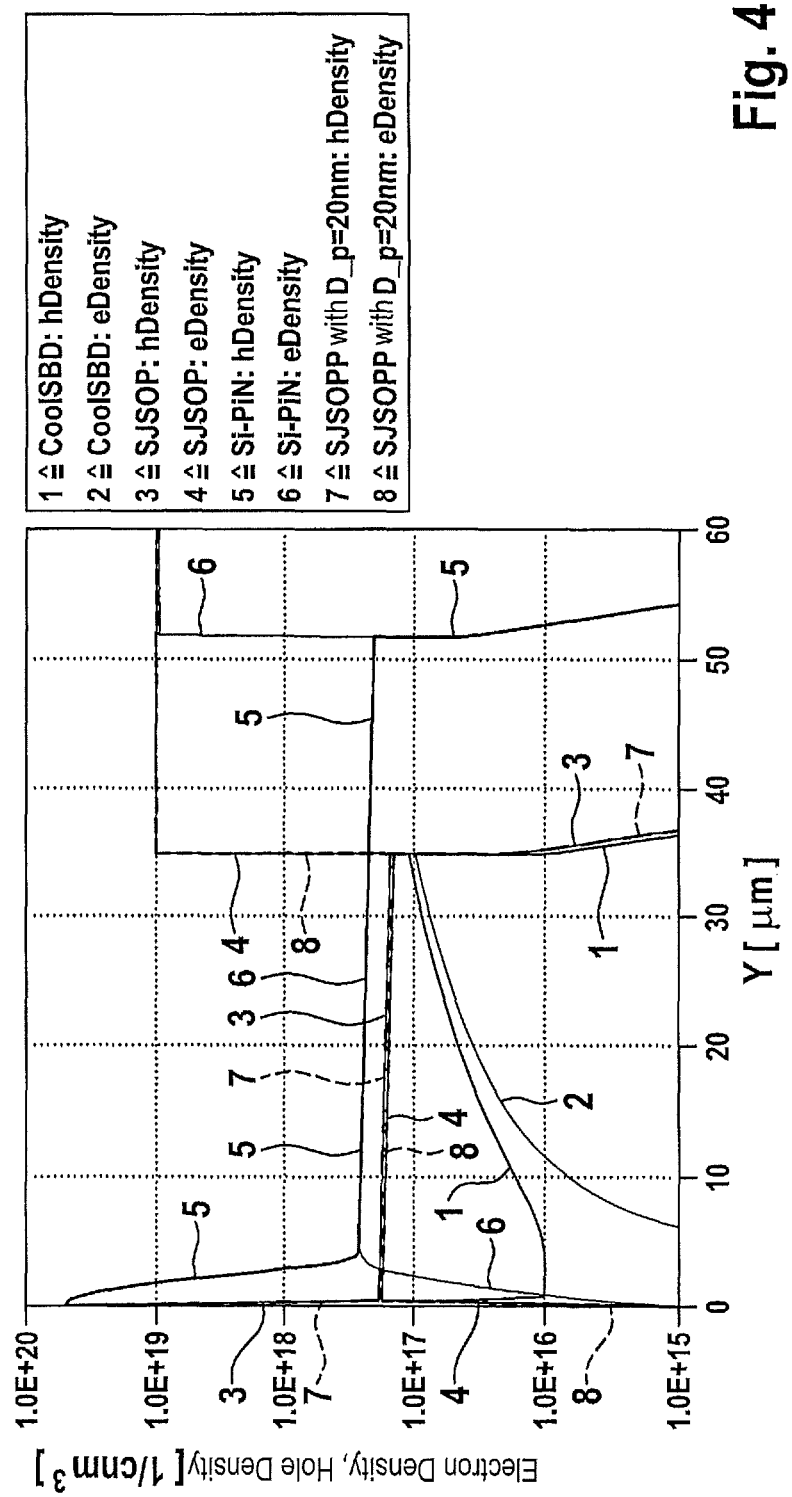
FIG. 4 shows a graph in which charge carrier distributions in the p-type epitaxial layer are illustrated.
Figure 5:
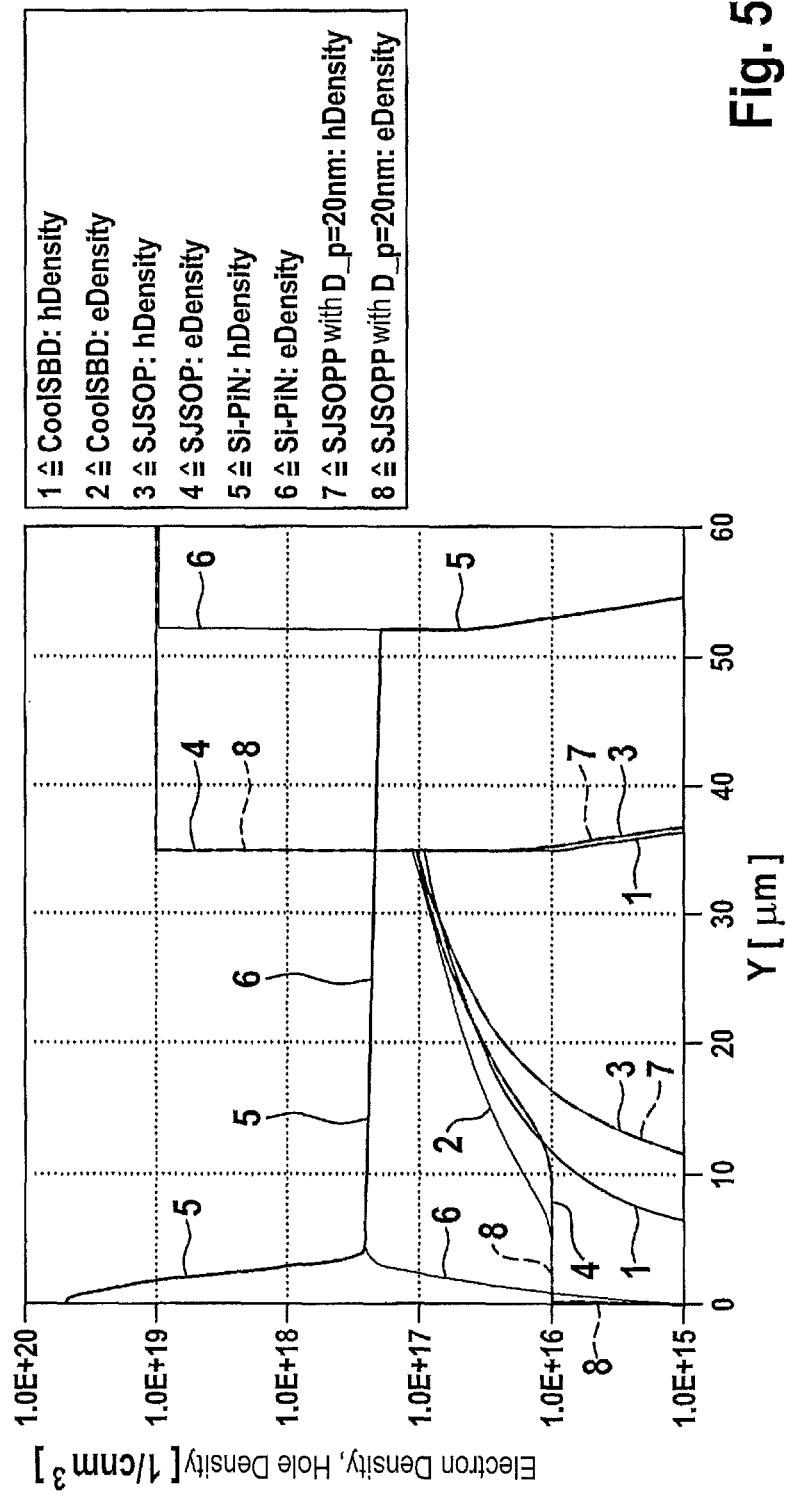
FIG. 5 a graph in which charge carrier distributions in the n-type epitaxial layer are illustrated.

The calculated charge carrier distributions in the p-type and n-type regions are illustrated in FIGS. 4 and 5. There, in each instance, vertical extension Y, beginning at the bottom edge of first metallic layer 50, is plotted along the abscissa, and the electron density (eDensity) and the hole density (hDensity) are plotted along the ordinate. It is apparent that in the n-type region, there are only small differences between the cool SBD and the SJSOPP (and the SJSOP, as well), but in the case of the SJSOPP (and the SJSOP), there is a flood of electrons and holes over the entire p-type region. In addition, it is apparent that the charge carrier distributions of the SJSOPP of the present invention are nearly the same as those of the SJSOP. This means that the effect on the conducting-state performance, of the thin p-type layers 80 that are directly under the Schottky contact and have a thickness D_p=20 nm and a dopant concentration N_p=$10^{16}$ cm$^{-3}$, is negligible.

Figure 6:
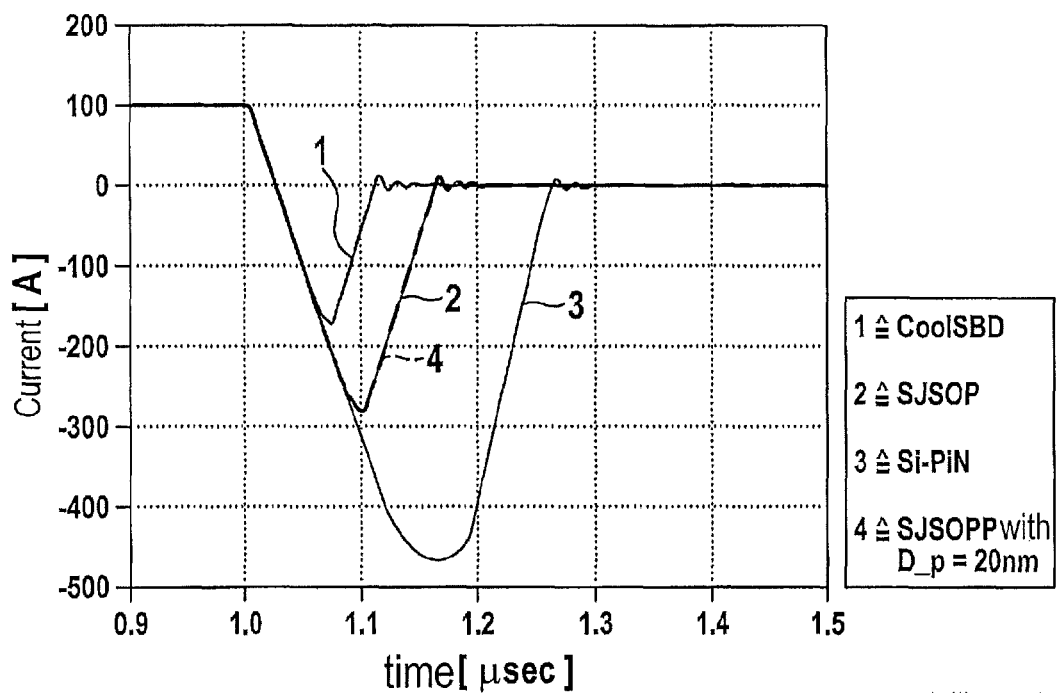
FIG. 6 shows a graph in which the switching-off performance is illustrated.

The switching losses of the SJSOPP are also nearly identical to those of the SJSOP. Because of the higher minority carrier concentration (electrons in the lightly doped p-type regions 30), the switching performance of the structure of the present invention is somewhat more unfavorable than in the case of the cool SBD, but considerably better than in the case of a PIN diode. These circumstances are illustrated in FIG. 6, in which the time is plotted along the abscissa and the current is plotted along the ordinate.

Figure 7:
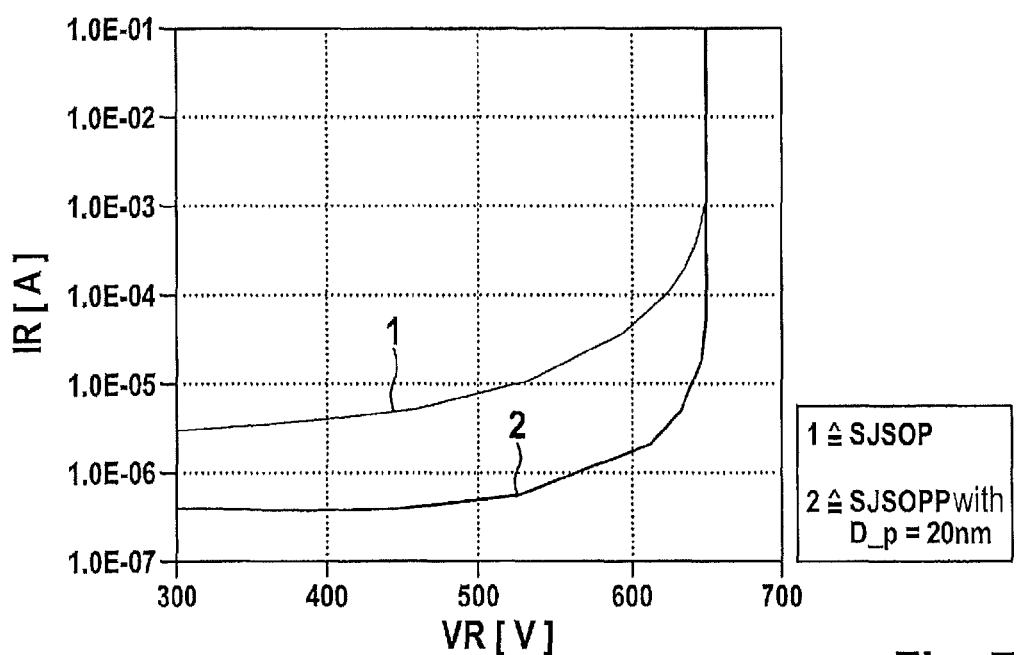
FIG. 7 shows a graph in which the breakdown behavior is illustrated.

At comparable breakdown voltages (650 V), the reverse currents of the SJSOPP in accordance with the present invention are markedly lower than in the case of a SJSOP, due to the shielding effect of the thin p-type layers 80 directly below the Schottky contact. This is illustrated in FIG. 7, in which reverse voltage VR is plotted along the abscissa and reverse current IR is plotted along the ordinate.

Figure 8:
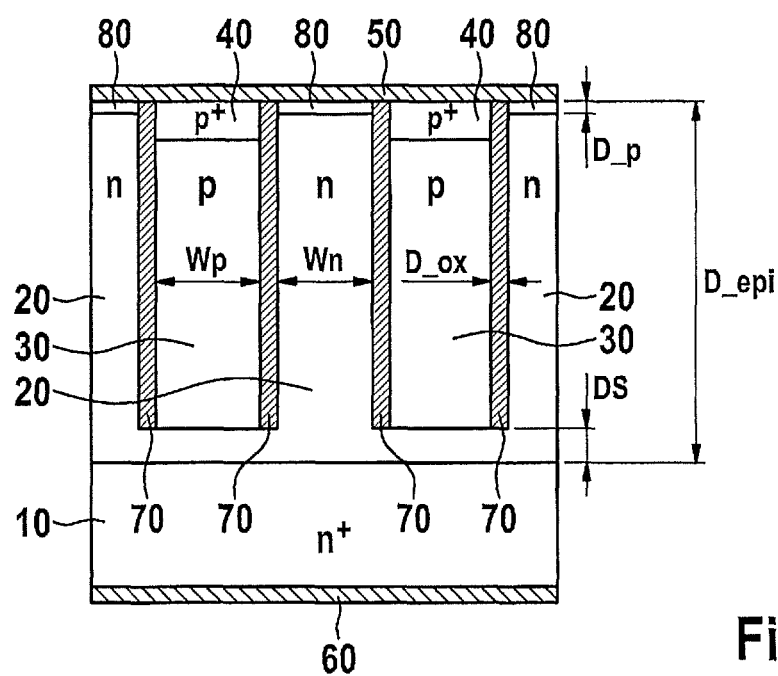
FIG. 8 shows a cross-sectional view of a detail of a second embodiment of a semiconductor chip according to the present invention.

A cross-sectional view of a detail of a second exemplary embodiment of a diode according to the present invention is shown in FIG. 8. In contrast to the set-up according to FIG. 2, p-type trenches 30 and oxide layers 70 do not end at n/n$^+$ transition 20-10, but at a certain distance DS above it.

The present invention is not limited to trenches, which are filled with p-type semiconductor material and situated in an n-type epitaxial layer. A p-type epitaxial layer 20, which has a heavily doped p-type region 40 at the upper surface, and into which trenches 30 filled with n-type semiconductor material are introduced, may also be present in place of the n-type epitaxial layer. In this alternative, all of the semiconductor layers are each of the other conductivity type, first metallic layer 50 is used as a cathode electrode and second metallic layer 60 is used as an anode electrode.

What is claimed is:
1. A semiconductor chip, comprising:
a first metallic layer;
a second metallic layer;
a substrate layer containing a high dopant concentration of a first dopant type, provided between the first metallic layer and the second metallic layer;
an epitaxial layer having a dopant concentration of the first dopant type, provided between the substrate layer and the first metallic layer;

at least one trench provided in the epitaxial layer that is filled with semiconductor material having a dopant concentration of a second dopant type;

at least one dielectric layer provided between the semiconductor material of the first dopant type in the epitaxial layer and the semiconductor material of the second dopant type used to fill the trench;

a shielding layer having a dopant concentration of the second dopant type provided between the semiconductor material of the first dopant type of the epitaxial layer and the first metallic layer, wherein the shielding layer is doped in a sufficiently shallow and weak manner such that a sequence of the first metallic layer, the shielding layer, and the epitaxial layer of the first dopant type forms a Schottky contact in which the shielding layer is located under a Schottky contact situated between the first metallic layer and the semiconductor material of the first dopant type; and a contacting layer having a dopant concentration of the second dopant type that is higher than the dopant concentration of the semiconductor material of the second dopant type used to fill the trench and provided between the semiconductor material of the second dopant type used to fill the trench and the first metallic layer, wherein the contacting layer forms an ohmic contact with the first metallic layer.

2. The semiconductor chip as recited in claim 1, wherein the at least one trench is contacted by the substrate layer.

3. The semiconductor chip as recited in claim 1, wherein a lower side of each trench filled with p-type semiconductor material is at a distance from the n+-type substrate.

4. The semiconductor chip as recited in claim 1, wherein a first width is a width of the trench, a second width is a distance between adjacent trenches, and the first and second widths and the dopant concentrations of the-epitaxial layer and the material used to fill the at least one trench are selected in such a manner, that the epitaxial layer and the filled trench are completely depleted of carriers when a maximum reverse voltage is applied.

5. The semiconductor chip as recited in claim 1, wherein the dielectric layers are silicon dioxide layers.

6. The semiconductor chip as recited in claim 1, wherein the dopant concentration of the epitaxial layer is $10^{16}$ cm−3.

7. The semiconductor chip as recited in claim 1, wherein the semiconductor chip has a breakdown voltage greater than 200V.

8. The semiconductor chip as recited in claim 1, wherein a first width is a width of the trench, a second width is a distance between adjacent trenches, and the first width and the second width are in a range between 1 μm and 4 μm, a depth of the epitaxial layer is between 30 μm and 80 μm, and a width of the dielectric layers is between 10 nm and 100 nm.

9. The semiconductor chip as recited in claim 1, wherein a thickness of the shielding layer is selected to be between 10 nm and 50 nm, and wherein the dopant concentration of the shielding layer is selected to be between $10^{15}$ cm$^{-3}$ and $10^{16}$ cm$^{-3}$.

10. The semiconductor chip as recited in claim 1, wherein the first dopant type is n-type, the second dopant type is p-type, the first metallic layer is an anode electrode, and the second metallic layer is a cathode electrode.

11. The semiconductor chip as recited in claim 1, wherein the semiconductor chip is part of a rectifier of a motor vehicle generator.

12. The semiconductor chip as recited in claim 1, wherein the first dopant type is p -type, the second dopant type is n-type, the first metallic layer is a cathode electrode, and the second metallic layer is an anode electrode.

13. The semiconductor chip as recited in claim 1, wherein the dopant concentration and thickness of the shielding layer is lower in concentration and smaller in thickness than the contacting layer.

14. The semiconductor chip as recited in claim 13, wherein a dopant concentration of the shielding layer is such that the shielding layer is partially transparent with respect to a Schottky diode that includes the Schottky contact.

15. The semiconductor chip as recited in claim 1, wherein the shielding layer partially shields the Schottky contact and thereby reduces a reverse current of a Schottky diode that includes the Schottky contact without increasing a forward voltage or a switching loss.

\* \* \* \* \*